United States Patent
Satoh et al.

(10) Patent No.: US 11,808,807 B2
(45) Date of Patent: Nov. 7, 2023

(54) SEMICONDUCTOR INTEGRATED CIRCUIT DEVICE AND INSPECTION METHOD FOR SEMICONDUCTOR INTEGRATED CIRCUIT DEVICE

(71) Applicant: Hitachi Astemo, Ltd., Hitachinaka (JP)

(72) Inventors: Akeo Satoh, Hitachinaka (JP);
Kazunori Nemoto, Hitachinaka (JP);
Akira Kotabe, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 161 days.

(21) Appl. No.: 17/594,431

(22) PCT Filed: Apr. 3, 2020

(86) PCT No.: PCT/JP2020/015285
§ 371 (c)(1),
(2) Date: Oct. 15, 2021

(87) PCT Pub. No.: WO2020/217925
PCT Pub. Date: Oct. 29, 2020

(65) Prior Publication Data
US 2022/0187363 A1    Jun. 16, 2022

(30) Foreign Application Priority Data
Apr. 23, 2019   (JP) ................................. 2019-081653

(51) Int. Cl.
*G01R 31/28*      (2006.01)
(52) U.S. Cl.
CPC ................ *G01R 31/2879* (2013.01)

(58) Field of Classification Search
CPC ............ G01R 31/2856; G01R 31/2875; G01R 31/2877
See application file for complete search history.

(56) References Cited

U.S. PATENT DOCUMENTS

| | | | |
|---|---|---|---|
| 5,393,991 A | | 2/1995 | Kawakami |
| 2003/0025511 A1* | | 2/2003 | Gaither ............... G01R 31/3167 324/606 |

(Continued)

FOREIGN PATENT DOCUMENTS

| | | |
|---|---|---|
| JP | 6-130131 A | 5/1994 |
| JP | 2006-234577 A | 9/2006 |

(Continued)

OTHER PUBLICATIONS

International Search Report (PCT/ISA/210) issued in PCT Application No. PCT/JP2020/015285 dated Aug. 11, 2020 with English translation (six (6) pages).

(Continued)

*Primary Examiner* — Tung X Nguyen
(74) *Attorney, Agent, or Firm* — Crowell & Moring LLP (57) ABSTRACT

A semiconductor integrated circuit device and an inspection method for a semiconductor integrated circuit device capable of improving burn-in screening quality by improvement in an activation rate of a DSP without operating a diagnostic circuit at the time of wafer level burn-in in a semiconductor integrated circuit device incorporating an analog circuit and the diagnostic circuit for the analog circuit are provided.

13 Claims, 11 Drawing Sheets

(56) References Cited

U.S. PATENT DOCUMENTS

| | | | |
|---|---|---|---|
| 2005/0030056 A1* | 2/2005 | Woo | G01R 31/318511 324/750.05 |
| 2005/0065747 A1 | 3/2005 | Premy et al. | |
| 2007/0076495 A1 | 4/2007 | Mochida et al. | |
| 2007/0162799 A1 | 7/2007 | Kamada | |
| 2009/0058453 A1 | 3/2009 | Jinbo | |
| 2010/0229057 A1 | 9/2010 | Ishizuka | |

FOREIGN PATENT DOCUMENTS

| | | |
|---|---|---|
| JP | 2007-157282 A1 | 6/2007 |
| JP | 2007-163301 A | 6/2007 |
| JP | 2008-032448 A | 2/2008 |
| JP | 2008-172097 A | 7/2008 |
| JP | 2009-53130 A | 3/2009 |
| JP | 2010-203898 A | 9/2010 |
| JP | 2012-84787 A | 4/2012 |

OTHER PUBLICATIONS

Japanese-language Written Opinion (PCT/ISA/237) issued in PCT Application No. PCT/JP2020/015285 dated Aug. 11, 2020 (three (3) pages).

* cited by examiner

SEMICONDUCTOR INTEGRATED CIRCUIT DEVICE AND INSPECTION METHOD FOR SEMICONDUCTOR INTEGRATED CIRCUIT DEVICE

TECHNICAL FIELD

The present invention relates to a circuit configuration and an inspection method for a semiconductor integrated circuit device, and particularly relates to a technique that is effective when applied to a semiconductor integrated circuit device that performs inspection by wafer level burn-in (WLBI).

BACKGROUND ART

Burn-in screening in which a semiconductor integrated circuit device (LSI) is driven while a load such as temperature is applied to the semiconductor integrated circuit device, and a failure latent in the LSI is selected in a short time is an essential process in quality assurance in LSI, particularly, in-vehicle LSI requiring high reliability.

Wafer level burn-in (WLBI) is a method of performing this burn-in screening on an LSI chip formed on a wafer.

In the wafer level burn-in (WLBI), a WLBI jig (WLBI probe) is stably brought into contact with a pad (PAD) electrode of an LSI chip, power is supplied and a signal is input and output, and the LSI chip on a wafer is driven under a high temperature to determine whether the LSI is good or bad.

As a background art of the present technical field, for example, there is a technique such as PTL 1. PTL 1 discloses a "wafer burn-in test method for changing a voltage level supplied to a gate of a column switch according to a cell write level". (Claim 1 of PTL 1)

Further, PTL 2 discloses "a semiconductor integrated circuit device incorporating an analog circuit, the semiconductor integrated circuit device comprising: a voltage circuit that varies a voltage to be output according to an input voltage value switching signal; and a switch element provided between an output of the voltage circuit and an analog signal input terminal of the analog circuit". (Paragraph [0009] of PTL 2)

CITATION LIST

Patent Literature

PTL 1: JP 2007-157282 A
PTL 2: JP 2008-32448 A

SUMMARY OF INVENTION

Technical Problem

In a case where an analog circuit is mounted in on-vehicle LSI, the analog circuit is generally arranged in pair with a diagnostic circuit for diagnosing the analog circuit in order to ensure high reliability.

In a case where wafer level burn-in (WLBI) is performed on LSI in which the diagnostic circuit is arranged, when a signal input PAD becomes in a release state, the diagnostic circuit operates and an internal state is fixed, an activation rate of a digital signal processing unit (DSP) decreases, and quality of burn-in screening (determination of good and bad of LSI) is lowered.

In contrast, when a voltage application pin is added to a WLBI jig (WLBI probe) for wafer level burn-in (WLBI), the cost of the WLBI jig (WLBI probe) increases.

In PTL 1 described above, burn-in is performed by setting a state in which an excessive voltage is not applied to a memory peripheral circuit (sense system circuit). However, a problem associated with the operation of the diagnostic circuit at the time of wafer level burn-in as described above is not described.

Further, in PTL 2 described above, a switch and a selection signal for switching between burn-in and normal operation with respect to input of an analog circuit are included, and an output of a voltage circuit is switched from an output of a voltage value switching signal generation circuit generated from an internal signal DINn_n and clock CLK and input to the analog circuit. However, a purpose of switching the voltage is not described, and, similarly to PTL 1, a problem associated with the operation of the diagnosis circuit at the time of wafer level burn-in is not described.

In view of the above, an object of the present invention is to provide a semiconductor integrated circuit device and an inspection method for a semiconductor integrated circuit device capable of improving an activation rate of a DSP and improving the quality of burn-in screening without operating the diagnostic circuit at the time of wafer level burn-in in a semiconductor integrated circuit device incorporating an analog circuit and a diagnostic circuit for the analog circuit.

Solution to Problem

In order to solve the above problem, a semiconductor integrated circuit device of the present invention includes an analog circuit, a diagnostic circuit that detects an abnormality on an input side of the analog circuit, a digital signal processing unit connected to an analog circuit output side, a voltage generation circuit that is connected to the input side of the analog circuit and generates a plurality of voltages, and a switch circuit that is provided between the analog circuit and the voltage generation circuit and is switched on when a burn-in switching signal is input. The voltage generation circuit outputs a plurality of voltages that do not cause the diagnostic circuit to function.

Further, a semiconductor integrated circuit device of the present invention includes an analog circuit, a diagnostic circuit that detects an abnormality on an input side of the analog circuit, a digital signal processing unit connected to an analog circuit output side, a voltage generation circuit that is connected to the input side of the analog circuit and generates a plurality of voltages, and a switch circuit that is provided between the analog circuit and the voltage generation circuit and is switched on when a burn-in switching signal is input. The diagnostic circuit stops a function of the diagnostic circuit when a burn-in switching signal is input.

Advantageous Effects of Invention

According to the present invention, a semiconductor integrated circuit device and an inspection method for a semiconductor integrated circuit device capable of improving burn-in screening quality without operating a diagnostic circuit at the time of wafer level burn-in in a semiconductor integrated circuit device incorporating an analog circuit and the diagnostic circuit for the analog circuit can be realized.

An object, a configuration, and an advantageous effect other than those described above will be clarified in description of an embodiment described below.

DESCRIPTION OF EMBODIMENTS

Hereinafter, an embodiment of the present invention will be described with reference to the drawings. Note that, in the drawings, the same configurations are denoted by the same reference numerals, and detailed description of overlapping portions is omitted.

First Embodiment

Figure 1:
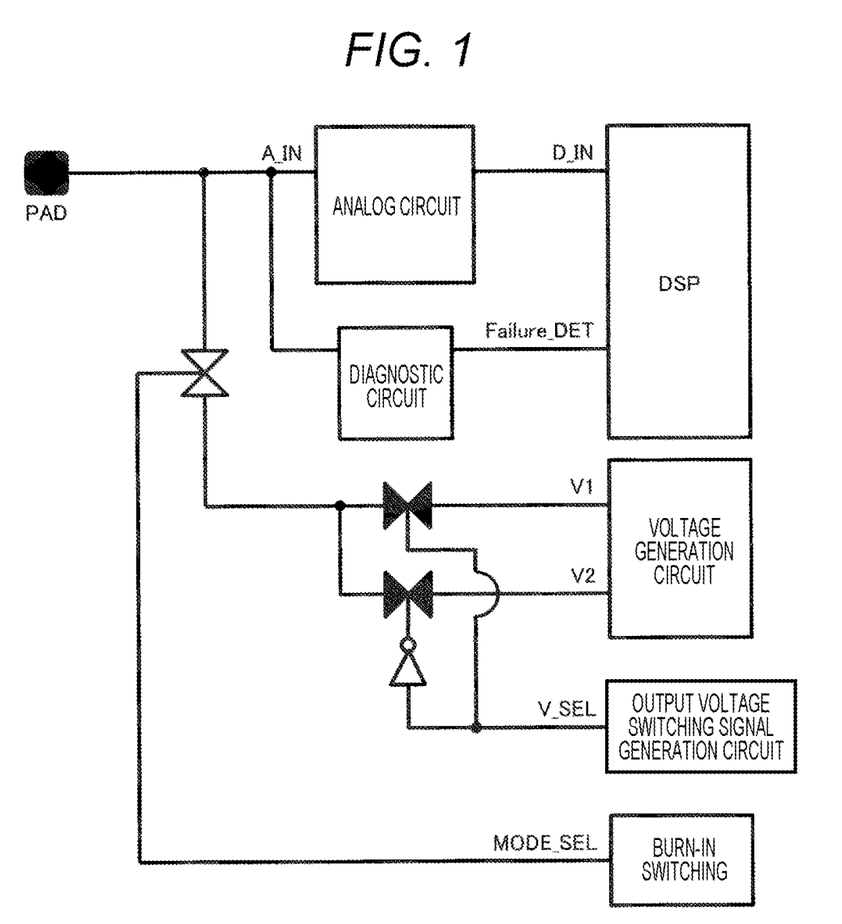
FIG. 1 is a diagram illustrating a circuit configuration of a semiconductor integrated circuit device according to a first embodiment.

A configuration of a semiconductor integrated circuit device according to a first embodiment of the present invention and an inspection method for the semiconductor integrated circuit device will be described with reference to FIGS. 1 to 9. FIG. 1 is a circuit configuration diagram of the semiconductor integrated circuit device according to the present embodiment.

As illustrated in FIG. 1, the semiconductor integrated circuit device of the present embodiment includes, as illustrated in FIG. 1, an analog circuit connected to a PAD electrode which is an external connection terminal, a diagnostic circuit that has a first end connected to an input side A_IN of the analog circuit and detects abnormality on the input side of the analog circuit, a digital signal processing unit DSP that is connected to an output side of the analog circuit and a second end of the diagnostic circuit, a voltage generation circuit that is connected to the input side of the analog circuit and generates a plurality of voltages V1 and V2, a burn-in switching circuit that is provided between the analog circuit and the voltage generation circuit and generates and outputs a burn-in switching signal MODE_SEL, and a switch circuit that is switched on when the burn-in switching signal MODE_SEL is input.

Further, the semiconductor integrated circuit device includes an output voltage switching signal generation circuit that generates an output voltage switching signal V_SEL for switching a plurality of the voltages V1 and V2 output from the voltage generation circuit. The output voltage switching signal V_SEL is output to the switch circuit arranged in each line of a plurality of the voltages V1 and V2, and ON/OFF control of the switch circuit of each line of the voltages V1 and V2 is performed, so that a voltage to be supplied to the analog circuit and the diagnostic circuit is switched. Note that, in FIG. 1, the output voltage switching signal V_SEL is output to the switch circuit of the voltage V2 line via a NOT circuit.

In normal operation of the semiconductor integrated circuit device, in a case where an abnormality on the input side of the analog circuit is detected, the diagnostic circuit outputs an abnormality detection signal Failure_DET to the digital signal processing unit DSP. Further, an input signal D_IN is input from the analog circuit to the digital signal processing unit DSP.

Figure 2:
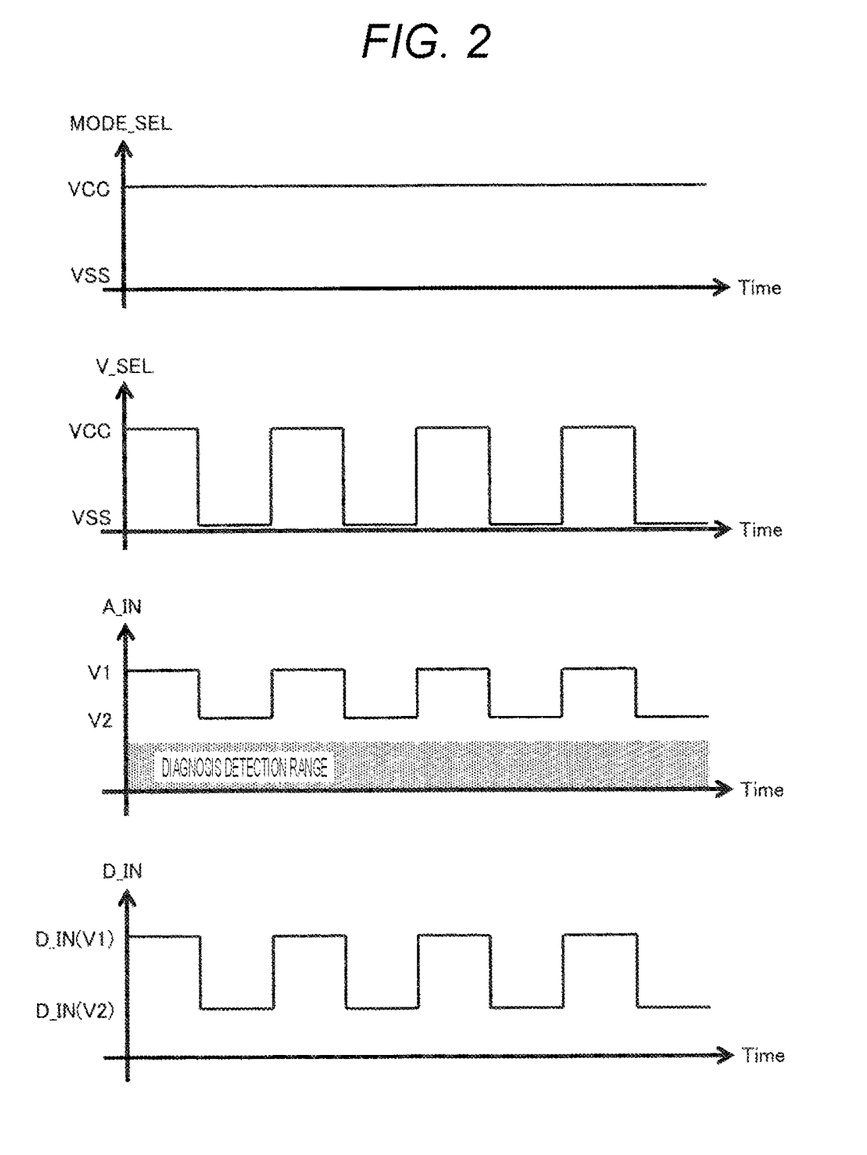
FIG. 2 is a timing chart illustrating operation of the semiconductor integrated circuit device according to the first embodiment.

FIG. 2 is a timing chart illustrating operation of the semiconductor integrated circuit device of FIG. 1 at the time of inspection by wafer level burn-in (WLBI). FIG. 2 shows the burn-in switching signal MODE_SEL, the output voltage switching signal V_SEL, the input-side voltage A_IN of the analog circuit, and the input signal D_IN to the digital signal processing unit DSP in order from the top, and the horizontal axis represents time (Time).

As illustrated in the graph of the input-side voltage A_IN of the analog circuit of FIG. 2, in the wafer level burn-in (WLBI) of the semiconductor integrated circuit device of the present embodiment, a plurality of the voltages V1 and V2 that do not cause the diagnostic circuit to function are generated.

At the time of burn-in, the input-side voltage A_IN of the analog circuit is switched to an output voltage from the voltage generation circuit from the external connection terminal (PAD electrode) by the burn-in switching circuit. The voltage generation circuit generates a plurality of the voltages V1 and V2 that do not cause the diagnostic circuit connected to the input side of the analog circuit to operate and change an output of the analog circuit, and switches an input voltage of the analog circuit by an output voltage changeover switch (switch circuit).

When the diagnostic circuit does not operate and the output of the analog circuit changes, input of the digital signal processing unit DSP transitions normally, and an internal activation rate of the digital signal processing unit DSP is improved according to the transition of the input.

According to the present embodiment illustrated in FIGS. 1 and 2, at the time of burn-in, a plurality of the voltages V1 and V2 that do not cause the diagnosis function to operate are switched and input to the analog circuit, so that it is possible to remove a voltage application terminal on the burn-in jig (WLBI jig) and improve an internal activation rate by switching of the input of the digital signal processing unit DSP.

Figure 3:
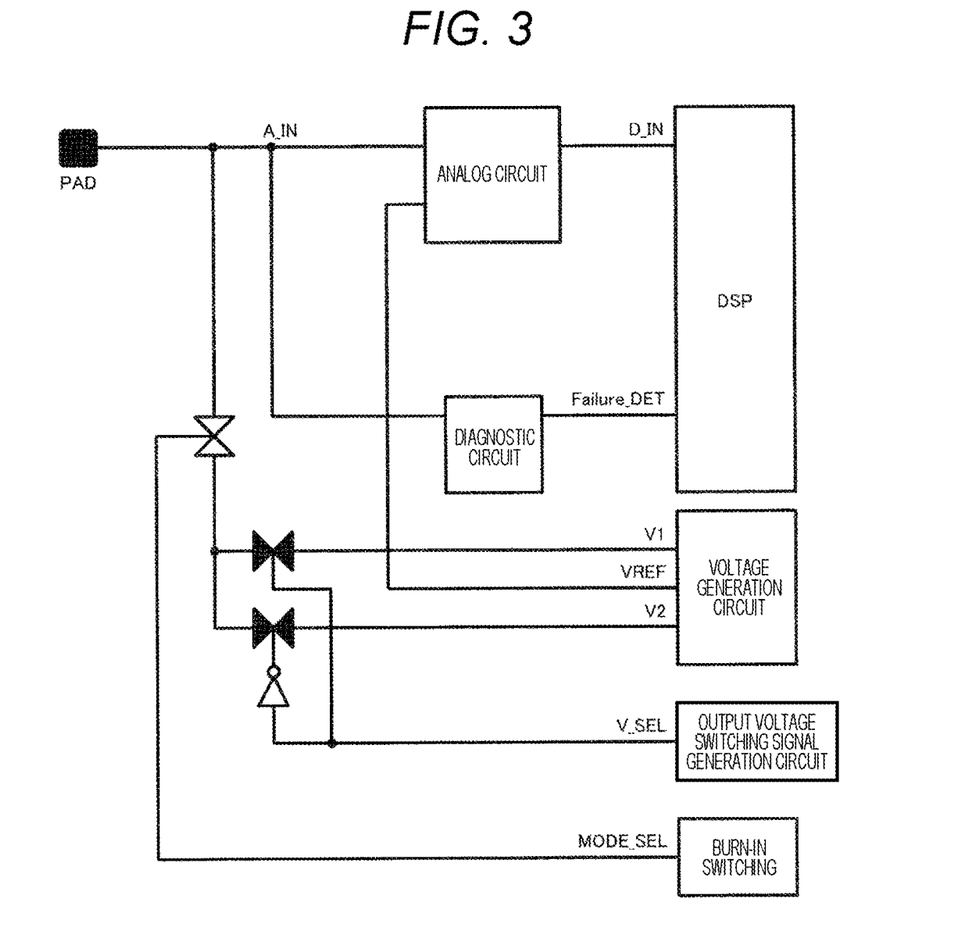
FIG. 3 is a diagram illustrating a variation (first variation) of FIG. 1.

FIG. 3 is a diagram illustrating a first variation of FIG. 1. In FIG. 3, the voltage generation circuit is also used as a reference voltage (VREF) generation circuit necessary for the analog circuit. The voltage generation circuit generates a plurality of the voltages V1 and V2, and also generates a reference voltage (VREF) necessary for the analog circuit.

By using the voltage generation circuit also as the reference voltage (VREF) generation circuit as shown in FIG. 3, the layout of the reference voltage (VREF) generation circuit becomes unnecessary, and shrinkage (reduction) of the chip size of the semiconductor integrated circuit device (LSI) can be achieved.

FIGS. 4 to 8 illustrate a specific circuit configuration example of the voltage generation circuit of FIG. 1. FIGS. 5, 6, 7, and 8 are a first variation, a second variation, a third variation, and a fourth variation of FIG. 4, respectively.

Figure 4:
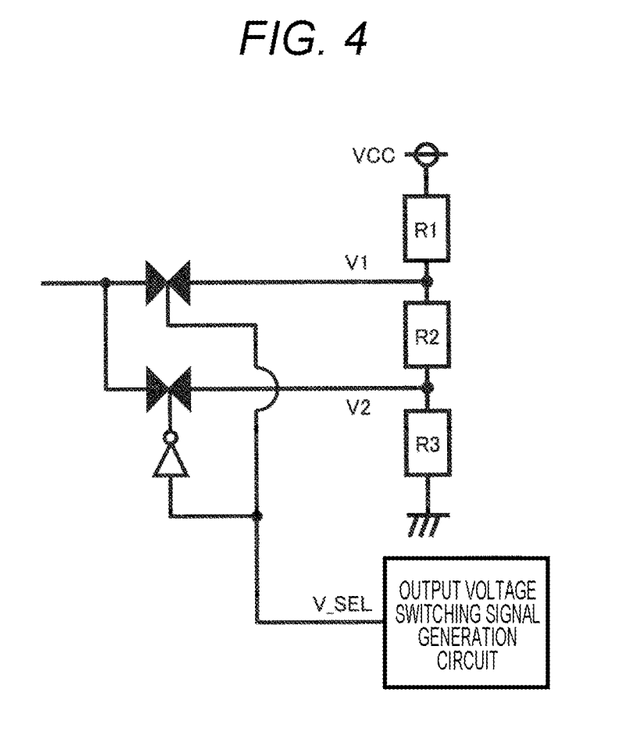
FIG. 4 is a diagram illustrating a circuit configuration of a voltage generation circuit of FIG. 1.

The voltage generation circuit illustrated in FIG. 4 includes power supply potential VCC, ground potential GND, and a plurality of resistance elements R1 to R3, and generates a first output voltage (V1) and a second output voltage (V2) by resistance division of the power supply potential VCC by a plurality of the resistance elements R1 to R3.

Figure 5:
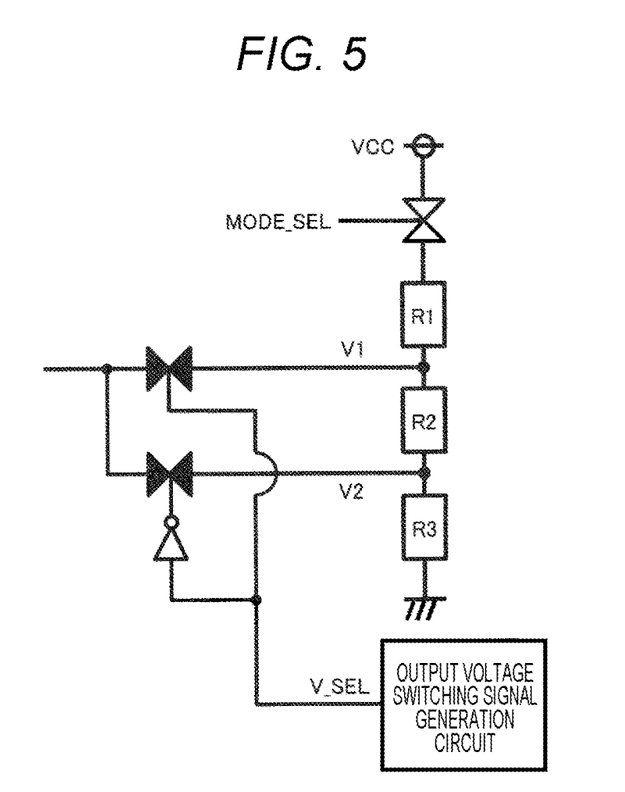
FIG. 5 is a diagram illustrating the variation (first variation) of FIG. 4.

The voltage generation circuit illustrated in FIG. 5 includes a switch circuit connected in series between the power supply potential VCC and a plurality of the resistance elements R1 to R3. The switch circuit includes an NMOS transistor, a PMOS transistor, or both, is on/off-controlled by the burn-in switching signal MODE_SEL, and is turned off during normal operation, so that unnecessary current does not flow during normal operation.

Figure 6:
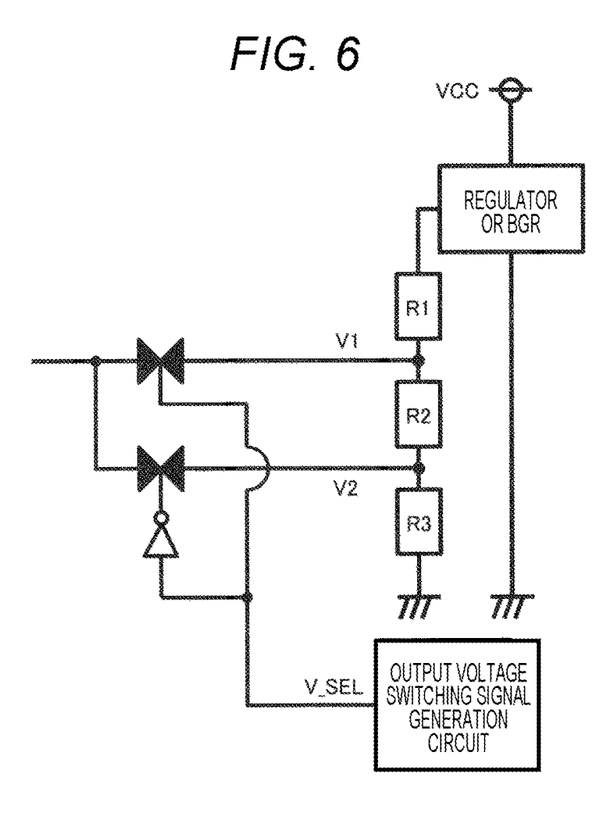
FIG. 6 is a diagram illustrating a variation (second variation) of FIG. 4.

The voltage generation circuit illustrated in FIG. 6 includes a constant voltage output circuit such as a regulator or a band gap reference (BGR) circuit connected in series between the power supply potential VCC and a plurality of the resistance elements R1 to R3. An output of the constant voltage output circuit is divided to generate the first output voltage (V1) and the second output voltage (V2).

Figure 7:
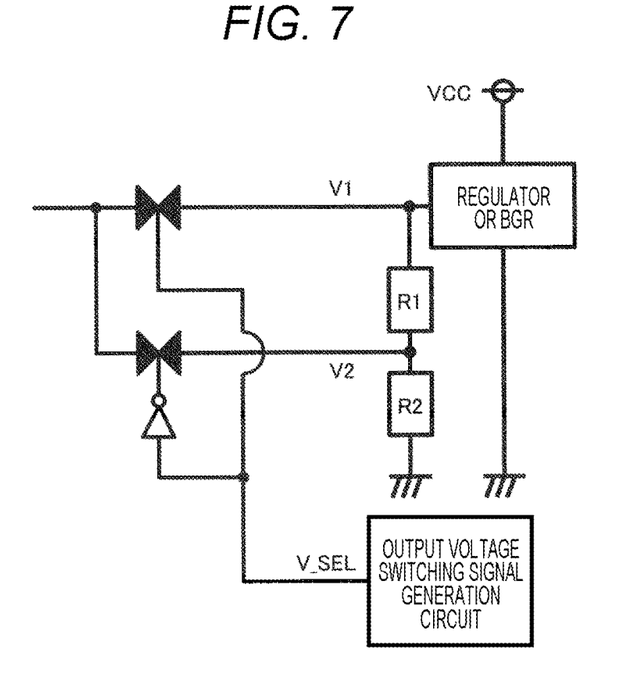
FIG. 7 is a diagram illustrating a variation (third variation) of FIG. 4.

The voltage generation circuit illustrated in FIG. 7 includes a constant voltage output circuit such as a regulator or a band gap reference (BGR) circuit connected in series between the power supply potential VCC and a plurality of the resistance elements R1 to R2. The constant voltage output circuit outputs the first output voltage (V1), and generates the second output voltage (V2) by resistance division of the first output voltage (V1) by a plurality of the resistance elements R1 and R2.

Figure 8:
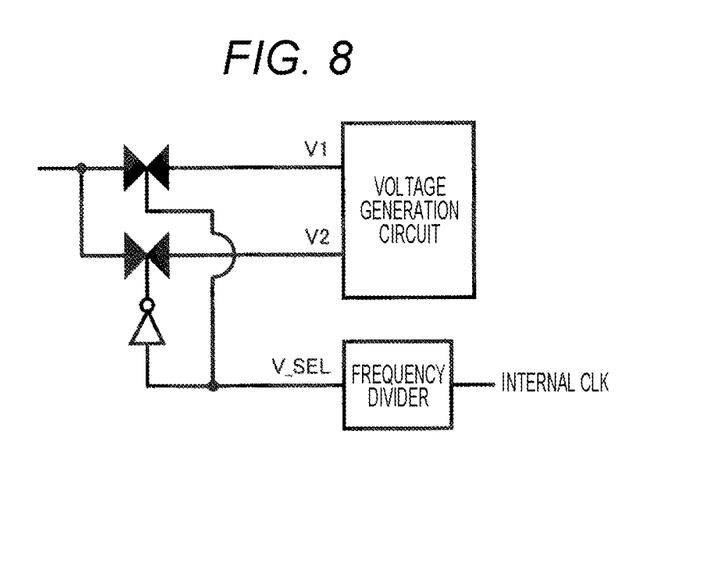
FIG. 8 is a diagram illustrating a variation (fourth variation) of FIG. 4.

The voltage generation circuit illustrated in FIG. 8 includes an output voltage switching signal generation circuit that switches outputs of a plurality of the voltages V1 and V2, and the output voltage switching signal generation circuit includes a clock signal (internal CLK) and a frequency divider in the semiconductor integrated circuit device. The frequency divider frequency-divides a clock signal (internal CLK) in the semiconductor integrated circuit device, and frequency-divides the clock signal to a frequency lower than an operation frequency of the analog circuit.

Figure 9:
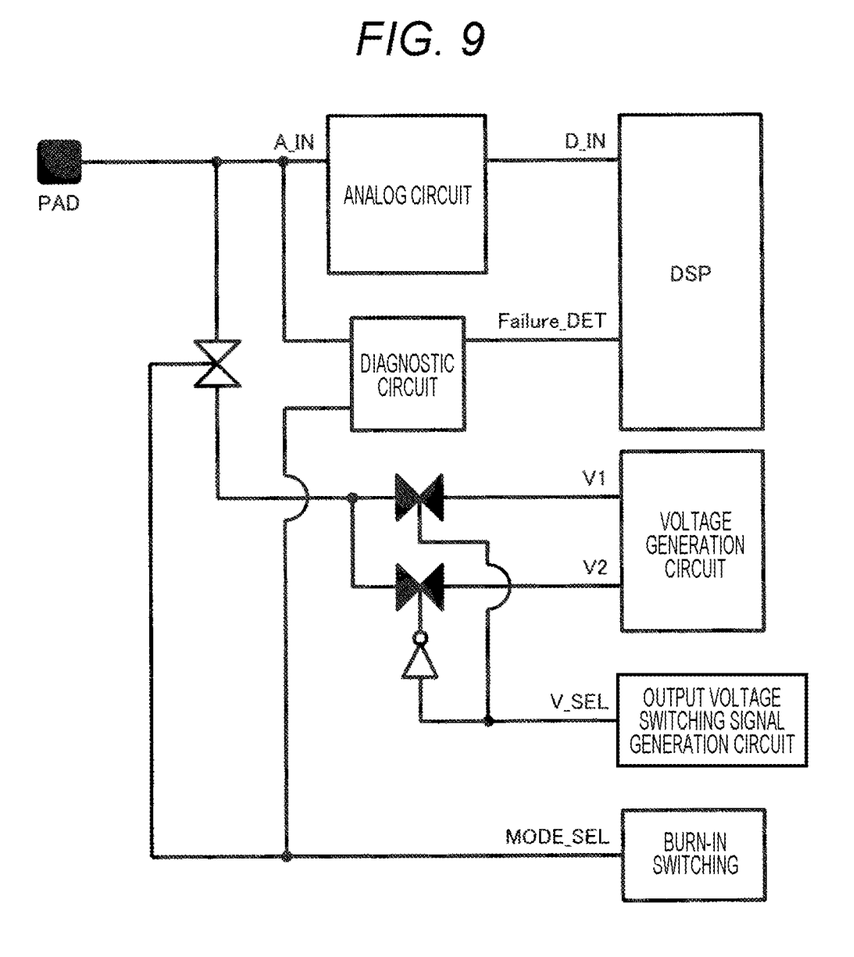
FIG. 9 is a diagram illustrating a variation (second variation) of FIG. 1.

FIG. 9 is a diagram illustrating a second variation of FIG. 1. In FIG. 1, the voltage generation circuit outputs a plurality of the voltages V1 and V2 that do not cause the diagnostic circuit to function, whereas in the configuration of FIG. 9, the burn-in switching circuit directly outputs the burn-in switching signal MODE_SEL to the diagnostic circuit. When the burn-in switching signal MODE_SEL is input, the diagnostic circuit stops its function.

As described above, according to the present embodiment, at the time of wafer level burn-in (WLBI), by switching the input of the analog circuit to a voltage that does not cause the diagnostic circuit mounted inside the LSI to operate, fixation of an internal state by the diagnostic circuit is avoided, and by generating a plurality of types of the voltages V1 and V2 and switching the input voltage, it is possible to improve an activation rate of the internal circuit such as the digital signal processing unit DSP.

Second Embodiment

A configuration of the semiconductor integrated circuit device according to a second embodiment of the present invention will be described with reference to FIG. 10.

Figure 10:
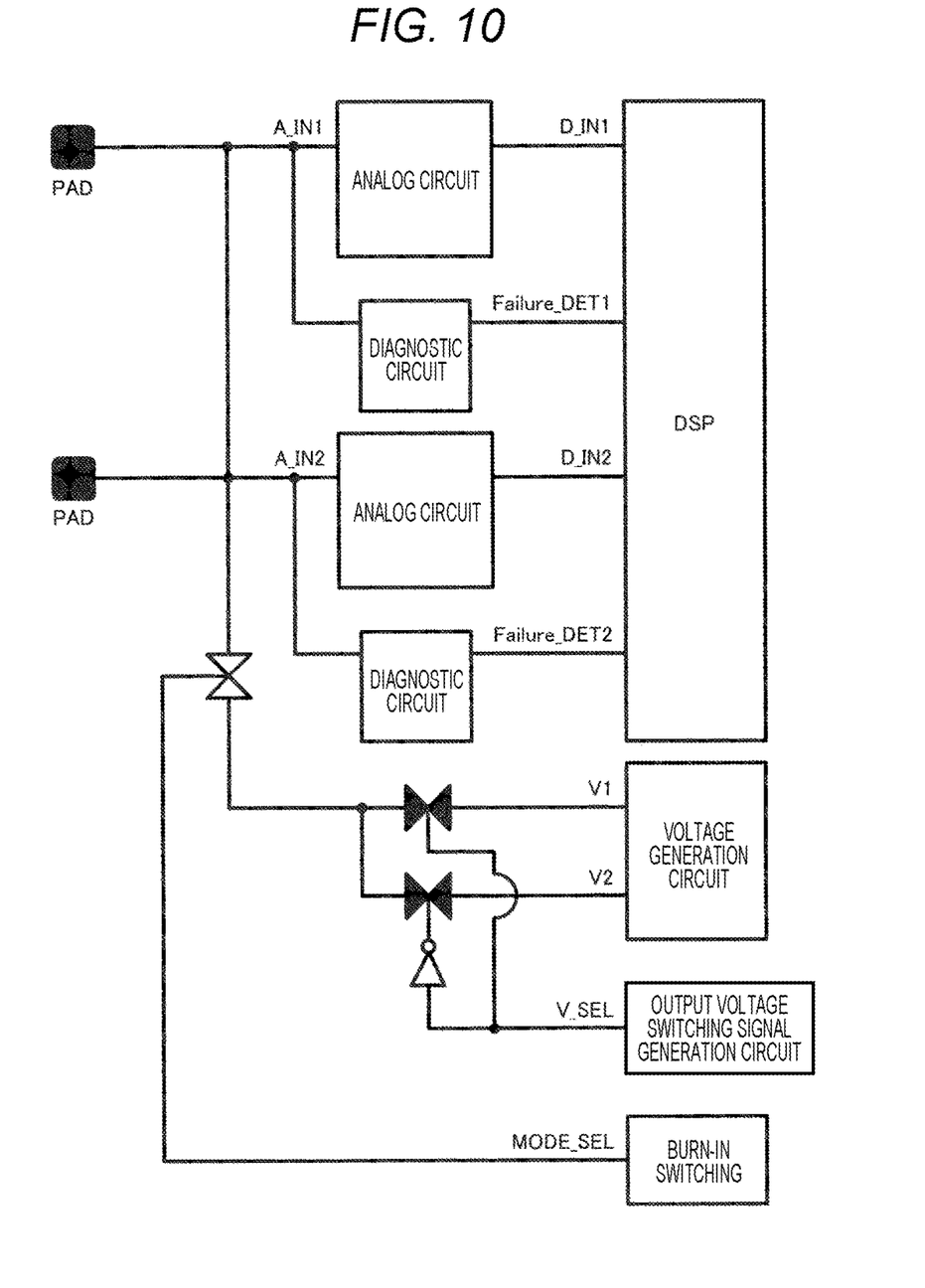
FIG. 10 is a diagram illustrating a circuit configuration of the semiconductor integrated circuit device according to a second embodiment.

FIG. 10 is a circuit configuration diagram of the semiconductor integrated circuit device according to the present embodiment.

As illustrated in FIG. 10, the configuration of the semiconductor integrated circuit device of the present embodiment is different from that of the semiconductor integrated circuit device of the first embodiment (FIG. 1) in that a plurality of the analog circuits and a plurality of the diagnostic circuits are provided, and each of a plurality of the analog circuits and a plurality of the diagnostic circuits is connected in parallel to the voltage generation circuit. That is, in the present embodiment, one voltage generation circuit is shared by a plurality of the analog circuits and the diagnostic circuits.

As in the present embodiment, with the configuration in which the voltages V1 and V2 that do not cause the diagnostic function of each analog circuit to operate are generated and applied to a plurality of the analog circuits each having a diagnostic function and having the external connection terminal (PAD electrode) as an input, the layout of the voltage generation circuit becomes unnecessary as compared with the case where the voltage generation circuit is provided in each of a plurality of the analog circuits and the diagnostic circuits, and shrinkage (reduction) of the chip size of the semiconductor integrated circuit device (LSI) can be achieved.

Third Embodiment

A configuration of the semiconductor integrated circuit device according to a third embodiment of the present invention will be described with reference to FIG. 11.

Figure 11:
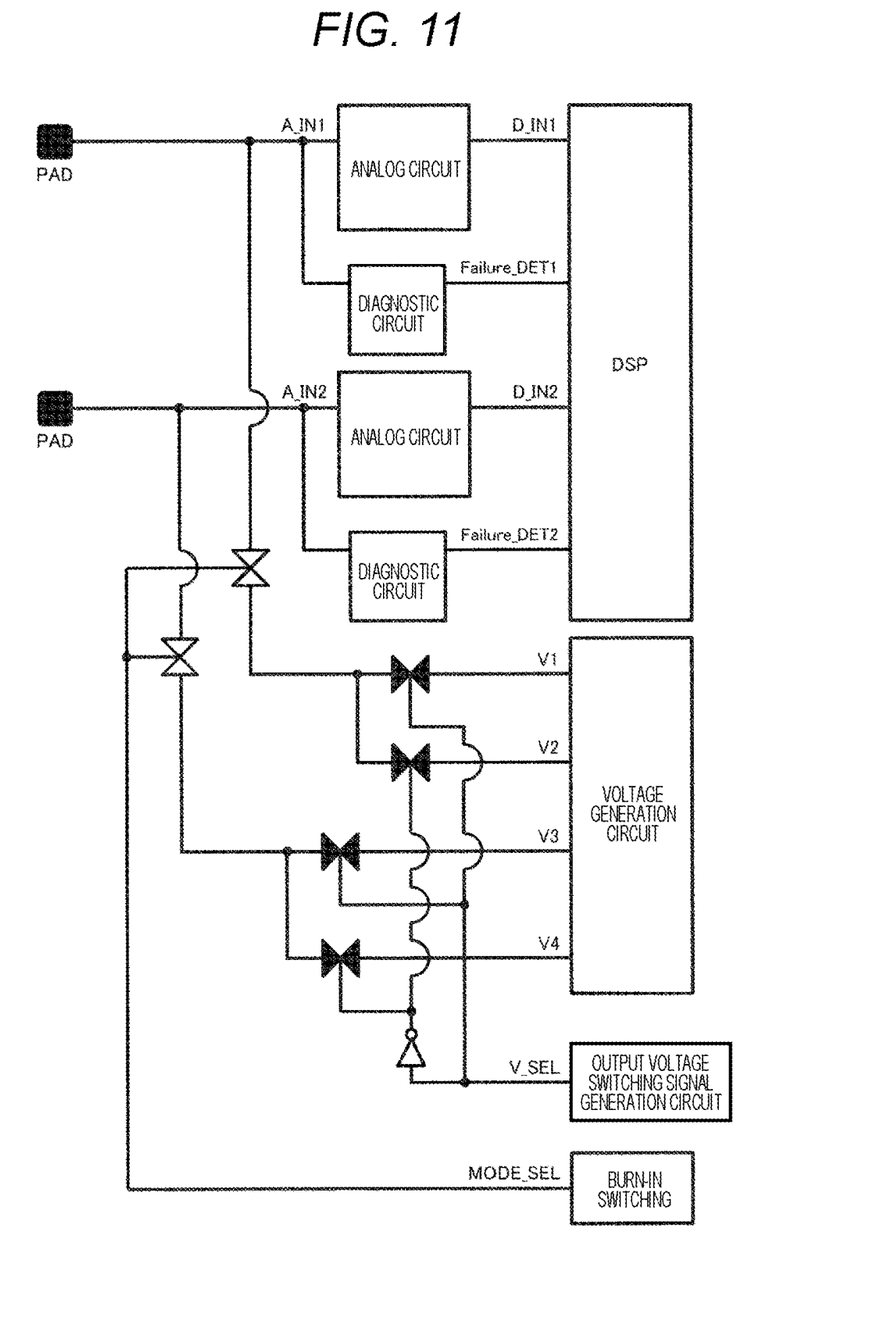
FIG. 11 is a diagram illustrating a circuit configuration of the semiconductor integrated circuit device according to a third embodiment.

FIG. 11 is a circuit configuration diagram of the semiconductor integrated circuit device according to the present embodiment.

As illustrated in FIG. 11, the configuration of the semiconductor integrated circuit device of the present embodiment is different from that of the semiconductor integrated circuit device of the second embodiment (FIG. 10) in that the voltage generation circuit generates a plurality of voltage sets V1, V2 and V3, V4 by which the activation rate of the digital signal processing unit is maximized for each of a plurality of the analog circuits and the diagnostic circuits.

As in the present embodiment, with respect to a plurality of the analog circuits each having a diagnostic function and having an external connection terminal (PAD electrode) as an input, the voltage sets V1, V2 and V3, V4 by which the activation rate is maximized for each of the analog circuits with a voltage that does not cause the diagnostic function of each of the analog circuits to operate are generated and applied, that is, optimum voltages are applied to a plurality of the analog circuits, so that the activation rate of the digital signal processing unit DSP is improved and burn-in quality is improved.

Fourth Embodiment

A configuration of the semiconductor integrated circuit device according to a fourth embodiment of the present invention will be described with reference to FIG. 12.

Figure 12:
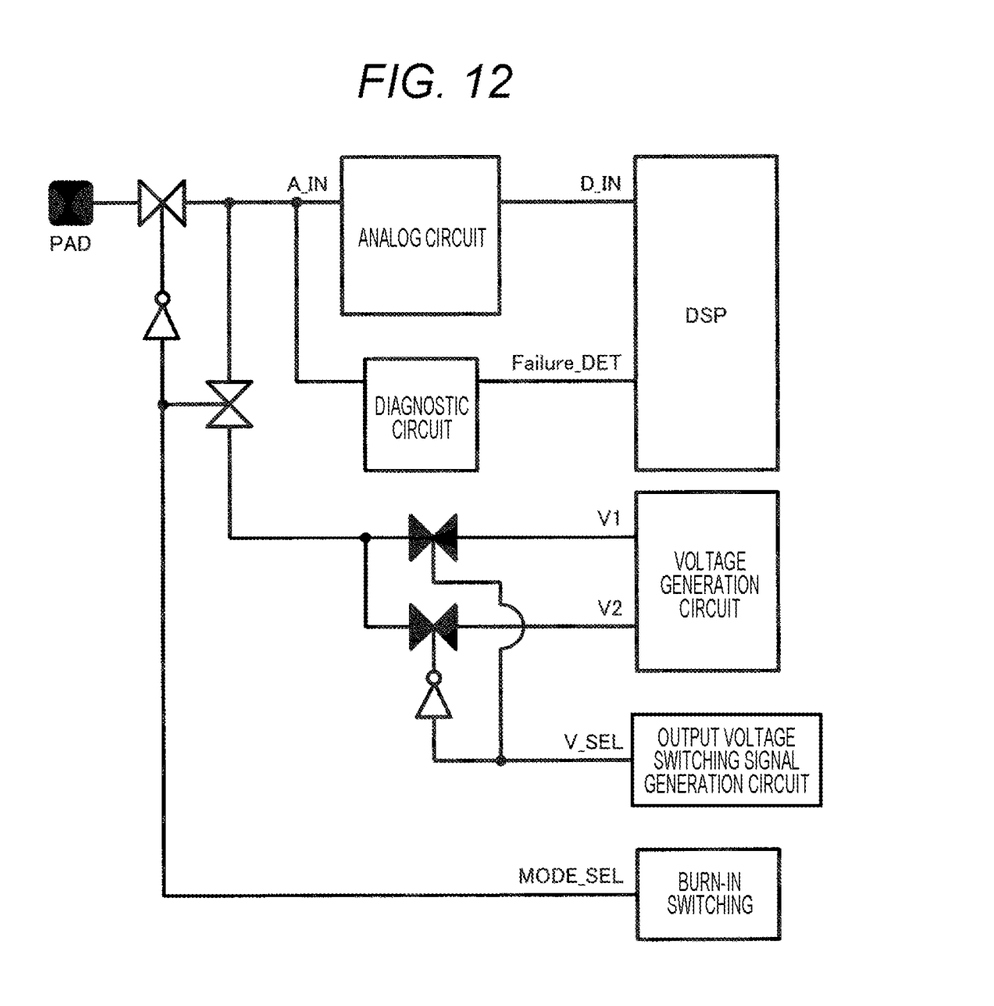
FIG. 12 is a diagram illustrating a circuit configuration of the semiconductor integrated circuit device according to a fourth embodiment.

FIG. 12 is a circuit configuration diagram of the semiconductor integrated circuit device according to the present embodiment.

As shown in FIG. 12, a configuration of the semiconductor integrated circuit device of the present embodiment is different from that of the semiconductor integrated circuit device of the first embodiment (FIG. 1) in that a switch circuit for cutting off an input signal input from an external connection terminal (PAD electrode) is provided between the external connection terminal (PAD electrode) and the analog circuit.

As in the present embodiment, by arranging the switch circuit for cutting off an input signal input from the external connection terminal (PAD electrode) between the external connection terminal (PAD electrode) and the analog circuit, even in a case where an external input signal such as a sensor input is input from the external connection terminal (PAD electrode), ON/OFF control of the switch circuit is performed by the burn-in switching signal MODE_SEL, so that the input signal input from the external connection terminal (PAD electrode) can be invalidated, and the voltages V1 and V2 from the voltage generation circuit can be switched.

Note that the present invention is not limited to the above embodiment and includes a variety of variations.

For example, the above embodiment is described in detail for easy understanding of the present invention, and the present invention is not necessarily limited to one that includes the entirety of the described configurations. Further, a part of a configuration of a certain embodiment can be replaced with a configuration of another embodiment, and a configuration of a certain embodiment can also be added to a configuration of another embodiment. Further, for a part of a configuration of each embodiment, other configurations can be added, removed, or replaced with.

REFERENCE SIGNS LIST

DSP digital signal processing unit
VCC power supply potential
R1, R2, R3 resistance element
BGR band gap reference (circuit)

The invention claimed is:

1. A semiconductor integrated circuit device comprising:
an analog circuit;
a diagnostic circuit that detects an abnormality on an input side of the analog circuit;
a digital signal processing unit connected to an analog circuit output side;
a voltage generation circuit that is connected to the input side of the analog circuit and generates a plurality of voltages; and
a switch circuit that is provided between the analog circuit and the voltage generation circuit and is switched on when a burn-in switching signal is input, wherein
the voltage generation circuit outputs a plurality of voltages that do not cause the diagnostic circuit to function.

2. The semiconductor integrated circuit device according to claim 1, wherein
the voltage generation circuit generates a reference voltage (VREF) necessary for the analog circuit.

3. The semiconductor integrated circuit device according to claim 1, wherein
the voltage generation circuit includes power supply potential, ground potential, and a plurality of resistance elements, and
generates a first output voltage (V1) and a second output voltage (V2) by resistance division of the power supply potential by the plurality of resistance elements.

4. The semiconductor integrated circuit device according to claim 3, wherein
the voltage generation circuit includes a switch circuit connected in series between the power supply potential and the plurality of resistance elements.

5. The semiconductor integrated circuit device according to claim 3, wherein
the voltage generation circuit includes a constant voltage output circuit of a regulator or a band gap reference (BGR) circuit connected in series between the power supply potential and the plurality of resistance elements, and
an output of the constant voltage output circuit is divided to generate the first output voltage (V1) and the second output voltage (V2).

6. The semiconductor integrated circuit device according to claim 1, wherein
the voltage generation circuit includes power supply potential, ground potential, and a plurality of resistance elements, the voltage generation circuit including a constant voltage output circuit of a regulator or a band gap reference (BGR) circuit connected in series between the power supply potential and the plurality of resistance elements,
the constant voltage output circuit outputs a first output voltage (V1), and
a second output voltage (V2) is generated by resistance division of the first output voltage (V1) by the plurality of resistance elements.

7. The semiconductor integrated circuit device according to claim 1, wherein
the voltage generation circuit includes an output voltage switching signal generation circuit that switches outputs of the plurality of voltages, and
the output voltage switching signal generation circuit includes a clock signal and a frequency divider in the semiconductor integrated circuit device.

8. A semiconductor integrated circuit device comprising:
an analog circuit;
a diagnostic circuit that detects an abnormality on an input side of the analog circuit;
a digital signal processing unit connected to an analog circuit output side;
a voltage generation circuit that is connected to the input side of the analog circuit and generates a plurality of voltages; and
a switch circuit that is provided between the analog circuit and the voltage generation circuit and is switched on when a burn-in switching signal is input, wherein
the diagnostic circuit stops a function thereof when a burn-in switching signal is input.

9. The semiconductor integrated circuit device according to claim 1, further comprising
a plurality of the analog circuits and a plurality of the diagnostic circuits, wherein
each of the plurality of analog circuits and the plurality of diagnostic circuits is connected in parallel to the voltage generation circuit.

10. The semiconductor integrated circuit device according to claim 9, wherein
the voltage generation circuit generates a voltage set that maximizes an activation rate of the digital signal processing unit for each of the plurality of analog circuits and the plurality of diagnostic circuits.

11. The semiconductor integrated circuit device according to claim 1, further comprising:
an external connection terminal; and
a switch circuit that cuts off an input signal input from the external connection terminal, the switch circuit provided between the external connection terminal and the analog circuit.

12. An inspection method for a semiconductor integrated circuit device incorporating
- an analog circuit;
- a diagnostic circuit that detects an abnormality on an input side of for the analog circuit;
- a diagnostic circuit that detects an abnormality on an input side of the analog circuit;
- a digital signal processing unit connected to an analog circuit output side;
- a voltage generation circuit that is connected to the input side of the analog circuit and generates a plurality of voltages; and
- a switch circuit that is provided between the analog circuit and the voltage generation circuit and is switched on when a burn-in switching signal is input, wherein
- the inspection being burn-in screening by wafer level burn-in, the inspection method comprising
- inputting a voltage that does not cause the diagnostic circuit to function to the analog circuit and the diagnostic circuit at the time of the wafer level burn-in.

13. The inspection method for a semiconductor integrated circuit device according to claim 12, wherein
- the voltage that does not cause the diagnostic circuit to function is a voltage that maximizes an activation rate of a digital signal processing unit.

\* \* \* \* \*